US007130432B2

(12) United States Patent
Lee et al.

(10) Patent No.: US 7,130,432 B2
(45) Date of Patent: Oct. 31, 2006

(54) SPEAKER MOUNTING SYSTEM AND METHOD

(75) Inventors: Noel Lee, Las Vegas, NV (US); Kendrew Lee, Fremont, CA (US)

(73) Assignee: Monster LLC, Las Vegas, NV (US)

( * ) Notice: Subject to any disclaimer, the term of this patent is extended or adjusted under 35 U.S.C. 154(b) by 62 days.

(21) Appl. No.: 10/654,627

(22) Filed: Sep. 2, 2003

(65) Prior Publication Data

US 2005/0045777 A1 Mar. 3, 2005

(51) Int. Cl.

| | |
|---|---|
| ***H04R 1/02*** | (2006.01) |
| ***H04R 9/06*** | (2006.01) |
| ***H05K 5/00*** | (2006.01) |
| ***F16M 11/00*** | (2006.01) |
| ***A47B 96/06*** | (2006.01) |

(52) U.S. Cl. ........................ 381/87; 381/336; 381/332; 381/335; 181/144; 181/145; 248/200; 248/205.1

(58) Field of Classification Search ................ 381/336, 381/332, 386, 387, 87, 182, 186, 345; 181/144, 181/145, 147, 153

See application file for complete search history.

(56) References Cited

U.S. PATENT DOCUMENTS 4,765,580 A * 8/1988 Wright .................... 248/181.1
4,811,406 A * 3/1989 Kawachi ..................... 381/186
4,865,153 A * 9/1989 Toyoda ...................... 181/153
4,953,223 A * 8/1990 Householder ............... 381/387
4,989,254 A * 1/1991 Amalaha .................... 381/424
5,286,928 A * 2/1994 Borland ...................... 181/153
5,309,518 A * 5/1994 Ickler et al. ................ 381/336
5,946,401 A * 8/1999 Ferren ......................... 381/82
6,151,206 A * 11/2000 Kato et al. .................. 361/681
6,173,064 B1 * 1/2001 Anagnos ..................... 381/353
6,484,983 B1 * 11/2002 Combest .................. 248/220.1
6,766,027 B1 * 7/2004 Ryan et al. ................. 381/182
2002/0168079 A1 * 11/2002 Kuerti et al. ............... 381/361
2003/0174855 A1 * 9/2003 Hawkins et al. ............ 381/386
2003/0235323 A1 * 12/2003 Chuang ...................... 381/386
2004/0101152 A1 * 5/2004 Fingleton .................... 381/336

OTHER PUBLICATIONS

U.S. Appl. No. 10/753,067, claims 1-3,8-10 and 18.*

* cited by examiner

*Primary Examiner*—Vivian Chin
*Assistant Examiner*—Devona E. Faulk
(74) *Attorney, Agent, or Firm*—LaRiviere, Grubman & Payne, LLP

(57) ABSTRACT

A system and a method for mounting a speaker unit (12). The system (12) containing a surface mounting bracket (14) including at least one attaching feature (20) and a speaker unit (12). The speaker unit (12) comprises at least one audio speaker (42) and a semi-circular shaped surface (41). The shaped surface (41) defines a plurality of angularly spaced apart receiving features (44). The plurality of angularly spaced apart receiving features (44) are adapted for removably engaging said at least one attaching feature (20). In another embodiment, a speaker mounting system (10) contains a detachable base stand (60) having at least one base attaching feature (62) and a speaker unit (12) defines a plurality of angularly spaced apart receiving features (44). The plurality of angularly spaced apart receiving features (44) are adapted for removably engaging said at least one base attaching feature (62).

20 Claims, 6 Drawing Sheets

SPEAKER MOUNTING SYSTEM AND METHOD

FIELD OF THE INVENTION

The present invention is related to a speaker mounting system and method. More particularly, the present invention is related to a speaker mounting system and method with a surface mounting bracket having an attaching feature and a speaker unit defining angularly spaced apart receiving features. Even more specifically, the attaching feature removably engages with one of the angularly spaced apart receiving features for providing speaker pointing angle adjustment.

BACKGROUND OF THE INVENTION

Speaker mounting systems must provide flexibility to a user for strategically positioning one or more speakers for maximizing acoustical listening quality within a given size, shape, or content-filled room while maintaining the room aesthetic quality. This speaker mounting flexibility has become more important with the increased popularity of home theater systems that include speakers of varying types, sizes, and power rating. This flexibility of speaker positioning and alignment within a given room is necessary, because speakers need to be aligned and pointed within a given size, shape, or content-filled room to maximize high fidelity home theater sound performance.

Current speaker mounting systems do not provide the needed mounting flexibility. For example, one typical speaker mounting system is a speaker stand which supports a speaker above a horizontal surface such as a floor. The speaker stand does provide vertical adjustment and provides limited options to locate a speaker. Another type of speaker mounting system is a fixed mounting bracket that will rigidly attach a speaker to a horizontal or a vertical surface. Some fixed mounting brackets are problematic, because they do not provide a fixed speaker angle adjustment. Other mounting brackets may include a base and adjustment arm and may optionally include a pivoting point being physically attached between the base and adjustment arm for adjusting the speaker angle. However, this pivoting mounting bracket is problematic, because the pivot point together with the adjustment arm may not provide an accurate user defined adjustment angle for the speaker or a secure mount. Further, the pivoting point will wear over time and with use, thereby causing the speaker to fall from adjustment. Thus, a need exists for a speaker mounting system which will produce and maintain repeatable speaker pointing accuracy and precision, overtime and with multiple speaker positioning. Consequently, a need exists for a speaker mounting system that can provide flexibility for a user to position one or more speakers of various type, size, and power output at various positions within a desired acoustical area as well as a speaker mounting system that can provide other additional advantages over presently available speaker mounting systems.

BRIEF SUMMARY OF THE INVENTION

Accordingly, the present invention involves a speaker mounting system and method The speaker mounting system comprises a surface mounting bracket, including at least one attaching feature, and a speaker unit. The speaker unit comprises at least one audio speaker and a semi-circular shaped surface. The semi-circular shaped surface comprises a plurality of angularly spaced apart receiving features. The plurality of angularly spaced apart receiving features are adapted for removably engaging the at least one attaching feature. As such, the present invention allows a user to attach and to detach at least one audio speaker from the surface mounting bracket. In addition, the present invention allows a user to position the speaker unit within a surface mounting bracket for adjusting the acoustic sound pattern in a given room.

In one embodiment, the at least one attaching feature is a flanged structure. The flanged structure mates with the plurality of angularly spaced apart receiving features. In another embodiment, a plurality of angularly spaced apart receiving features are flanged structures that radially extend from said semi-circular shaped surface.

A further feature of this invention is that the at least one audio speaker includes one or more rows of spaced apart speakers selected from a group consisting of tweeters and midrange speakers. In the alternative, the at least one audio speaker includes at least one row of speakers forming a linear array of speakers selected from a group consisting of tweeters and midrange. In the alternative, an optional feature of this invention is that the at least one audio speaker comprises multiple rows of spaced apart speakers.

An optional aspect of the speaker mounting system is that the semi-circular shaped surface further comprises an angle marking system being adapted to store a location for at least one audio speaker, wherein the at least one audio speaker comprises at least one row of spaced apart speakers selected from a group consisting of tweeters and midrange.

In another embodiment, the speaker mounting system has a detachable base stand, including at least one base attaching feature, and a speaker unit comprising at least one audio speaker and having a semi-circular shaped surface comprising a plurality of mechanically attached, angularly spaced apart receiving features. The plurality of angularly spaced apart receiving features are adapted for removably engaging said at least one base attaching feature.

One benefit of this is attachment and detachment method is that the speaker unit may be relocated to a location that is more acoustically desirable for a user's listening pleasure. Further, the present invention speaker mounting system allows a speaker unit to be slid in and out of the surface mounting bracket multiple times without the need for tools or complicated removal schemes. In contrast, prior art wall mounting brackets require a user to physically disconnect the speaker from a wall using tools, such as a screw driver or a wrench. Further, repositioning of prior art wall mounting brackets requires a user to drill new holes which will damage the mounting surface.

Another benefit of this invention is that it allows a user to accurately reposition a speaker in the same location from which it has been taken. This benefit results from a plurality of angularly spaced apart receiving features being fixed in position which allow repeatable speaker unit repositioning in discretely spaced degree increments even after many attachments and detachments of a speaker unit. In contrast, prior art wall brackets that pivot may not accurately, or with repeatable results, provide alignment of a speaker unit, because the pivot, which may be a wall bearing or riveted joint, will wear over time, thereby producing inaccurate speaker alignment or resulting in speaker pointing inaccuracy. Further, proper positioning of a speaker unit is critical for a home theater entertainment center, because a user wants the best sound quality for a given acoustical area.

BRIEF DESCRIPTION OF THE DRAWINGS

For a better understanding of the present invention, reference is made to the below-referenced accompanying drawings. Reference numbers refer to the same or equivalent parts of the present invention throughout the several figures of the drawings.

DETAILED DESCRIPTION OF THE INVENTION

Figure 1:
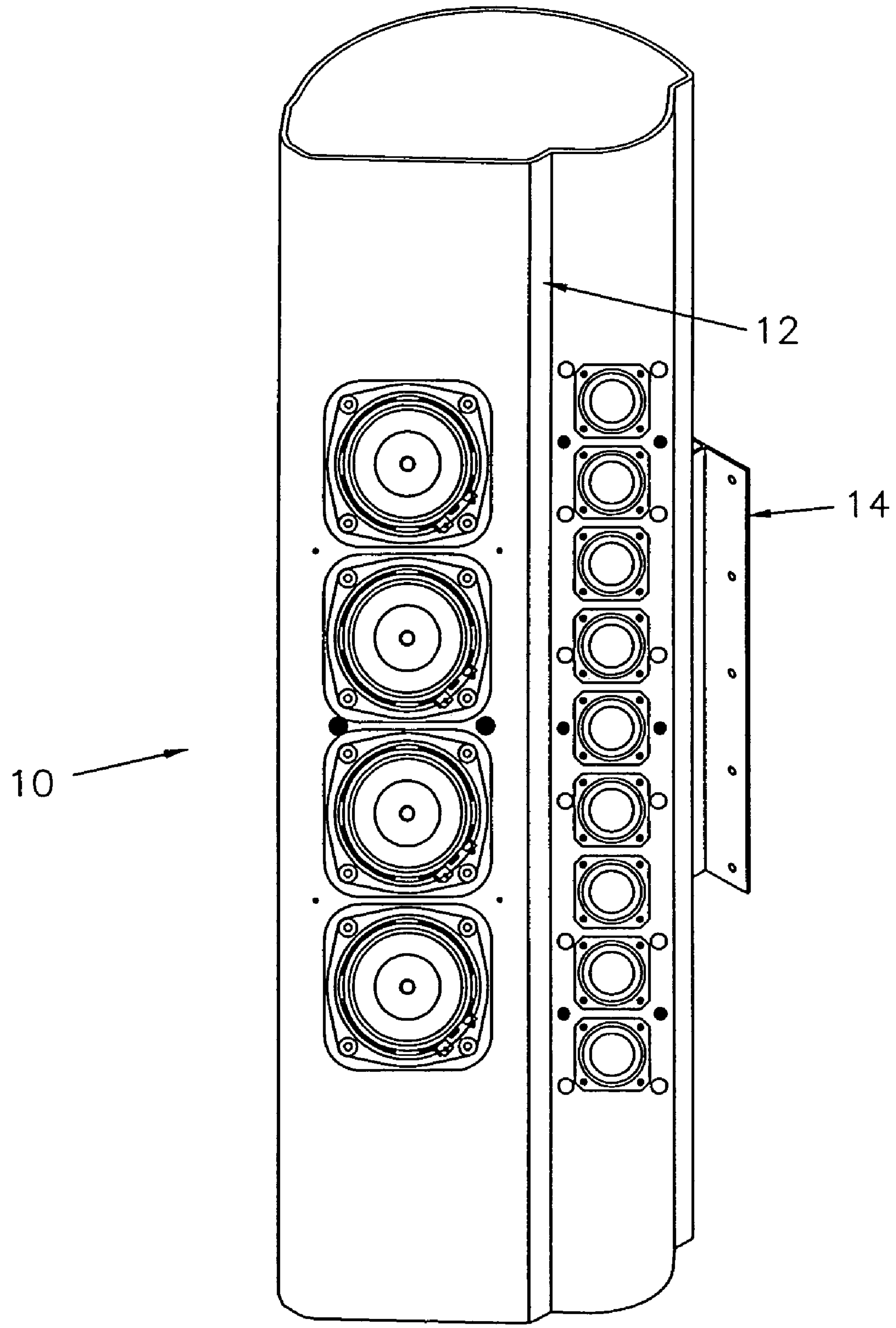
FIG. 1 is a perspective view of the speaker mounting system according to a first embodiment of the present invention.

Referring particularly to FIG. 1, a perspective view of a speaker mounting system 10, according to a first embodiment of the present invention, is shown. The speaker mounting system 10 is used to provide flexibility for a user for positioning one or more speakers of various type, size, and power output at various locations and at various angles within a desired acoustical area with repeatable speaker pointing accuracy and precision. The speaker mounting system 10 comprises an apparatus for mounting a speaker unit 12. The speaker mounting system 10 comprises a surface mounting bracket 14 and a speaker unit 12.

Figure 2C:
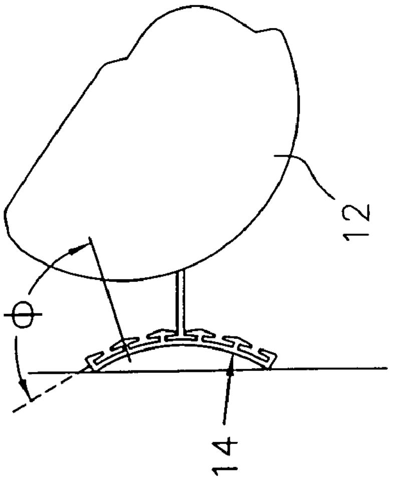
FIG. 2C is a side view of an alternative of the first embodiment of the present invention showing a semi-circular shaped surface mounting bracket.
Figure 2B:
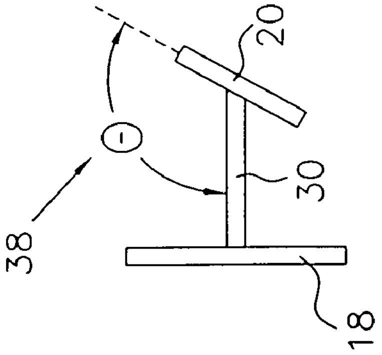
FIG. 2B is a side view of a surface mounting bracket and a bracket arm being connected at an angle θ to a bracket connecting surface according to the first embodiment of the present invention.
Figure 2A:
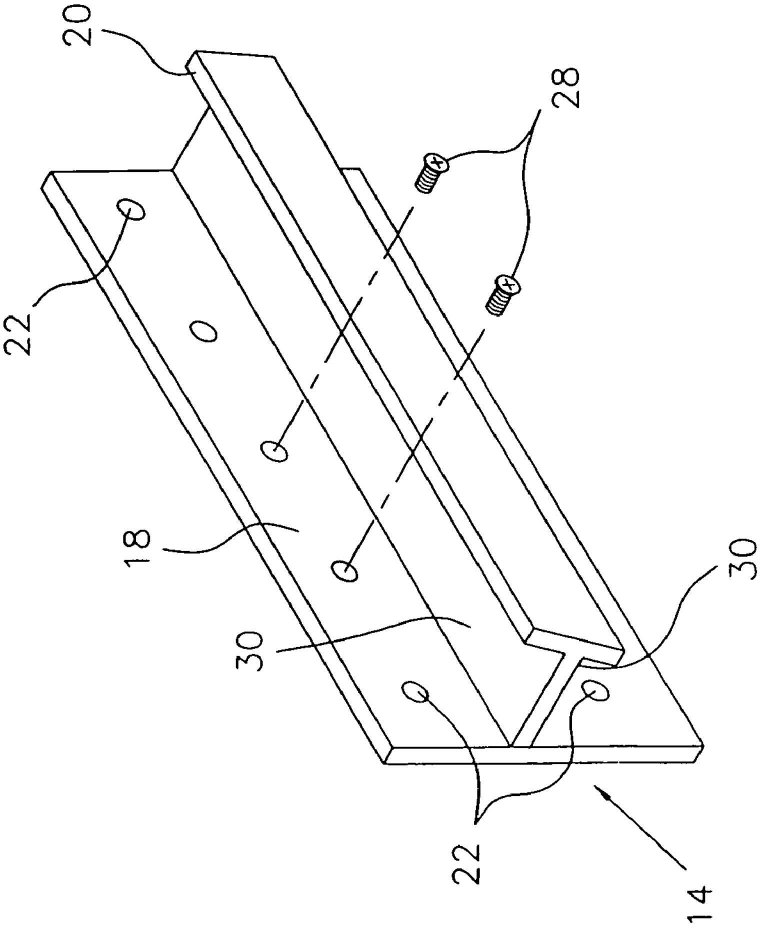
FIG. 2A is a perspective view of a surface mounting bracket having at least one attaching feature according to the first embodiment of the present invention.

Referring particularly to FIG. 2A, a perspective view is shown of at least one attaching feature of a surface mounting bracket according to the first embodiment of the present invention. Specifically, FIG. 2A depicts the surface mounting bracket 14. The surface mounting bracket 14 preferably comprises an extruded aluminum material. In the alternative, the surface mounting bracket 14 comprises any hard, medium durability and strength material, for example, wood, fiberglass, steel, plastic, aluminum alloy metal, composite metal, or the like. The surface mounting bracket 14 further comprises a bracket connecting surface 18 and at least one attaching feature 20. The bracket connecting surface 18 has a first connecting structure 22. The first connecting structure 22 is a hole pattern that accepts screws 28 that mechanically attach the surface mount bracket to a surface, for example a wall.

The at least one attaching feature 20 is a flanged structure that preferably comprises an extruded aluminum material. In the alternative, the at least one attaching feature 20 comprises a material such as a steel, a wood, an aluminum, a fiberglass, a metal alloy, an aluminum alloy, or a like material. As shown in FIG. 2B the at least one attaching feature 20 is mechanically connected to a bracket arm 30 at an angle θ which, in turn, mechanically connects to a bracket connecting surface 18. The angle θ provides a speaker unit 12 with an adjustment mechanism that is built into the surface mounting bracket 14. The angle may be any angle in a range of approximately between 0 degree to 90 degrees relative to the bracket arm 30 with the preferred range being 35 degrees to 55 degrees. As such, a user has one speaker mounting positioning and pointing flexibility option by using a bracket arm. The surface mounting bracket 14 may have length in a range of approximately 2 inches to approximately 30 inches, with the preferred range being approximately 5 inches to approximately 15 inches. The surface mounting bracket 14 may have width in a range of approximately 1 inch to approximately 6 inches, with the preferred range approximately 1 inch to approximately 3 inches. In one alternative of the present embodiment, as shown in FIG. 2C, a surface mounting bracket 14 is semi-circular shaped with one or more attaching features that may be connected at varying angles Φ providing more angular flexibility to position a speaker unit 12 with at least one receiving feature. In another alternative of the present embodiment, a surface mounting bracket comprises two smaller brackets. Further, the size, the material, the insertion point, and the location of a surface mounting bracket, at least one attaching feature, a first connecting surface, a bracket arm, and the at least one attaching feature, are only exemplary.

Figure 3C:
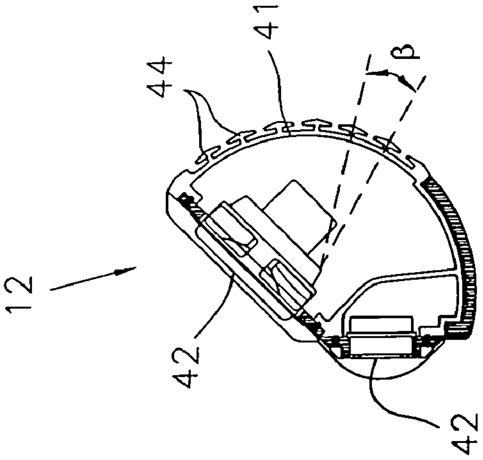
FIG. 3C is a side view of the speaker unit, having a plurality of angularly spaced apart receiving features, according to the first embodiment of the present invention.
Figure 3A:
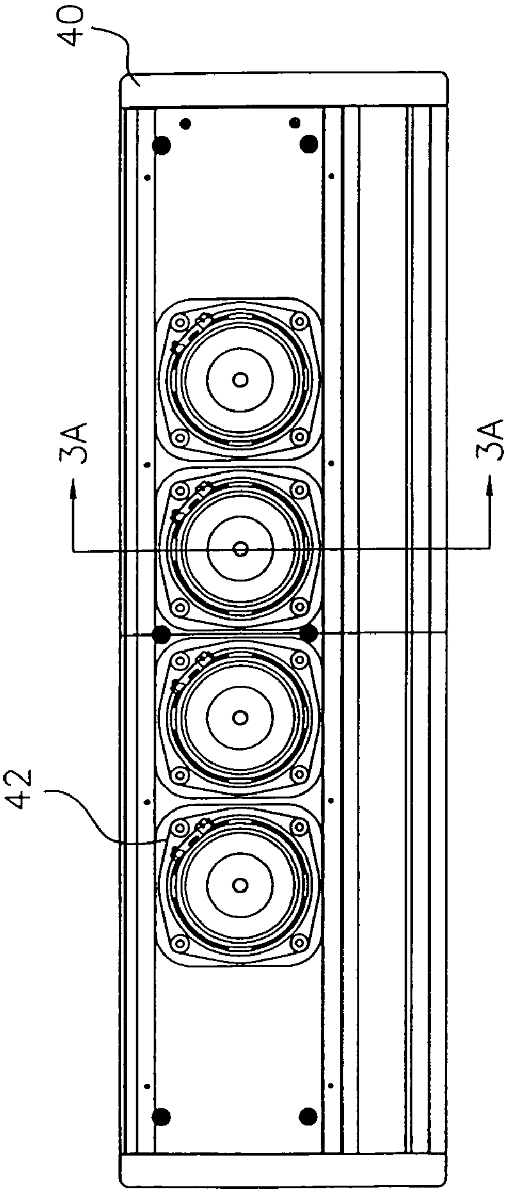
FIG. 3A is a front view of a speaker unit, including multiple spaced apart speakers, i.e., a first row of audio speakers, according to the first embodiment of the present invention.
Figure 3B:
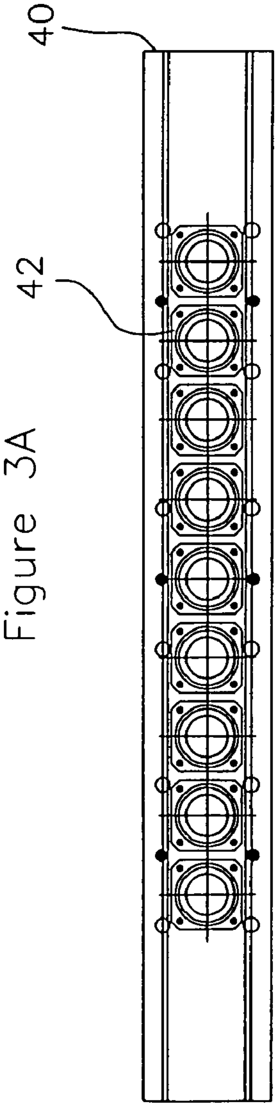
FIG. 3B is an off-angle side view of the speaker unit, including multiple spaced apart speakers, i.e., a second row of audio speakers, according to the first embodiment of the present invention.

Referring particularly to FIG. 3A, a front view of a speaker unit, including multiple spaced apart speakers, i.e., a first row of audio speakers, is shown according to the first embodiment of the present invention. Specifically, FIG. 3A depicts a speaker unit 12 comprising at least one audio speaker 40. FIG. 3B is an off-angle side view of the speaker unit 12, including multiple spaced apart speakers 42, i.e., a second row of audio speakers, according to the first embodiment of the present invention. The at least one audio speaker 40 includes two rows of spaced apart speakers 42 with the spaced apart speakers 42 chosen from a group consisting of tweeters and midrange speakers. The at least one audio speaker 40 has a length within the range of approximately 1 foot to 9 feet with the preferred length range of approximately 1.5 feet to 3 feet. The at least one audio speaker 40 has a width within the range of approximately 3 inches to 12 inches with the preferred width range of approximately 5 inches to 7 inches. In FIG. 3A, the spaced apart speakers 42 are pointed upward. The at least one speaker unit 12 comprises a composite material or wood baffle enclosing the spaced apart speakers 42. In the alternative, the spaced apart speakers 42 may be individually tilted or repositioned within the row to produce a desired acoustical sound within a room.

The at least one audio speaker 40 includes any audio producing spaced apart speakers 42 preferably selected from a group consisting of tweeters and midrange speakers. Further, FIG. 3C is a side view showing a plurality of angularly spaced apart receiving features 44 of a speaker unit 12 according to the first embodiment of the present invention. In the alternative, the at least one audio speaker comprises a spaced apart linear array of speakers to produce a desired sound acoustical pattern within a given room. In another alternative, at least one audio speaker comprises multiple rows of spaced apart speakers that form an array to produce a desired directional audio sound pattern.

Still referring to FIG. 3C, the speaker unit 12 further comprises a semi-circular shaped surface 41 defining a plurality of angularly spaced apart receiving features 44. The angularly spaced apart receiving features 44 are adapted to mate with the at least attaching feature 20 on the surface mounting bracket 14. The plurality of angularly spaced apart receiving features 44 are flanged structures that extend radially at an angle β from the semi-circular shaped surface 41. The plurality of angularly spaced apart receiving features 44 allow a user flexibility in selecting the proper location for positioning a speaker unit 12. The plurality of angularly spaced apart receiving features 44 are adapted for removably engaging the at least one attaching feature 20. The spacing of the plurality of angularly spaced apart receiving features 44 may be uniform, irregular, or any other chosen user-desired pattern disposed in between to produce a desired speaker angle adjustment. In the alternative, the semi-circular spaced surface 42 comprises any surface in a shape selected from a group consisting of flat, rectangular, oval, rounded, and partially hemispherical.

The plurality of angularly spaced apart receiving features 44 may be marked so that a user can accurately record or replace a speaker unit that has been previously removed. Also, the marking allows a user to correctly choose the proper speaker alignment the first time, because the marking may be angularly indicated. The plurality of angularly spaced apart receiving features 44 preferably comprise an extruded aluminum material. In the alternative, the plurality of spaced apart receiving feature 20 comprise a steel, a wood, an aluminum, a fiberglass, a metal alloy, an aluminum alloy, or a like material. Further, the at least one audio speaker comprise any medium durability and strength material such as fiberglass, wood, steel, aluminum, or metal alloy. Further, the size, the material, the insertion point, and the location of the spaced apart receiving feature and the semi-circular shaped surface features are only exemplary.

Figure 4:
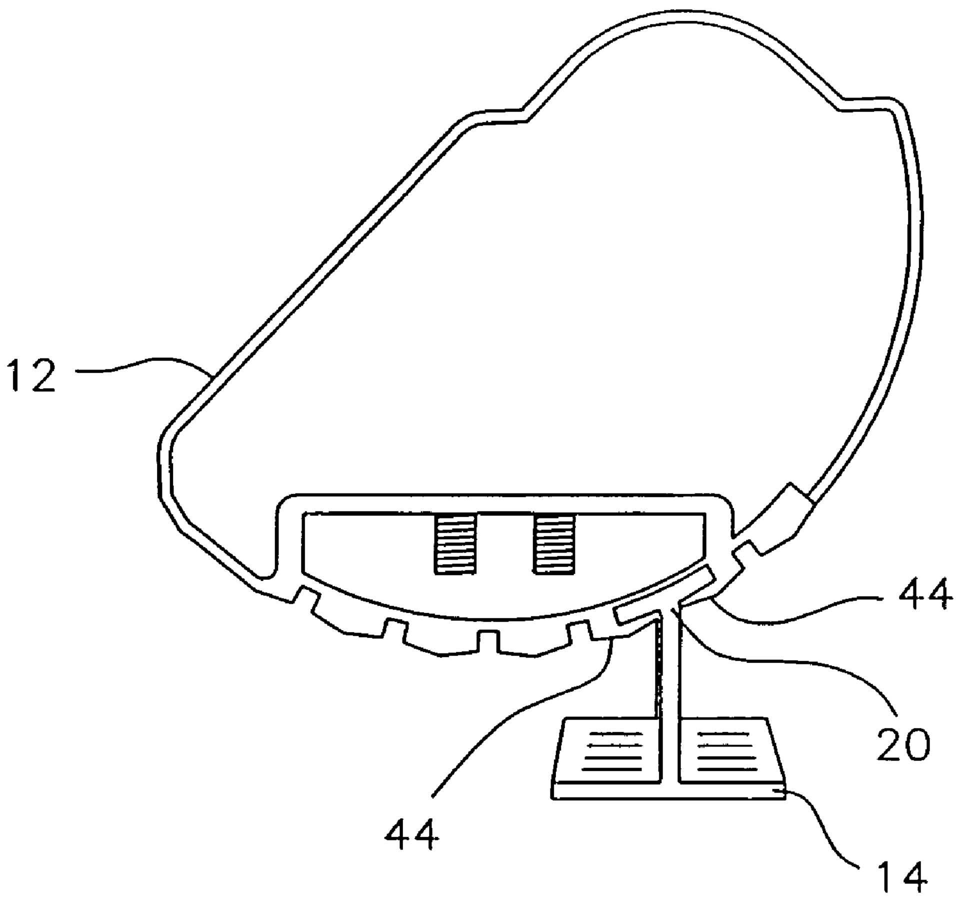
FIG. 4 is a perspective view of the present system, showing the mechanical cooperation of the at least one attaching feature of the surface mounting bracket with the plurality of angularly spaced apart receiving features of the speaker unit according to the first embodiment of the present invention.

FIG. 4 shows a perspective view of the speaker mounting system 10 according to the first embodiment of the present invention, showing the mechanical cooperation of the at least one attaching feature 20 of the surface mount bracket 14 and a plurality of angularly spaced apart receiving features 44 of the speaker unit 12. As shown in FIG. 4, to attach a speaker unit 12 at least one attaching feature 20 is inserted into, and engages, one of a plurality of angularly spaced apart receiving features 44 until the speaker unit 12 is securely positioned within one of the plurality of angularly spaced receiving features 42. To detach the speaker unit 12 from the surface mounting bracket 14, the speaker unit 12 is slid away from the surface mounting bracket 14 until the plurality of angularly spaced apart receiving features 44 are not connected to the at least on attaching feature 20; and the speaker unit 12 is removed.

Figure 5:
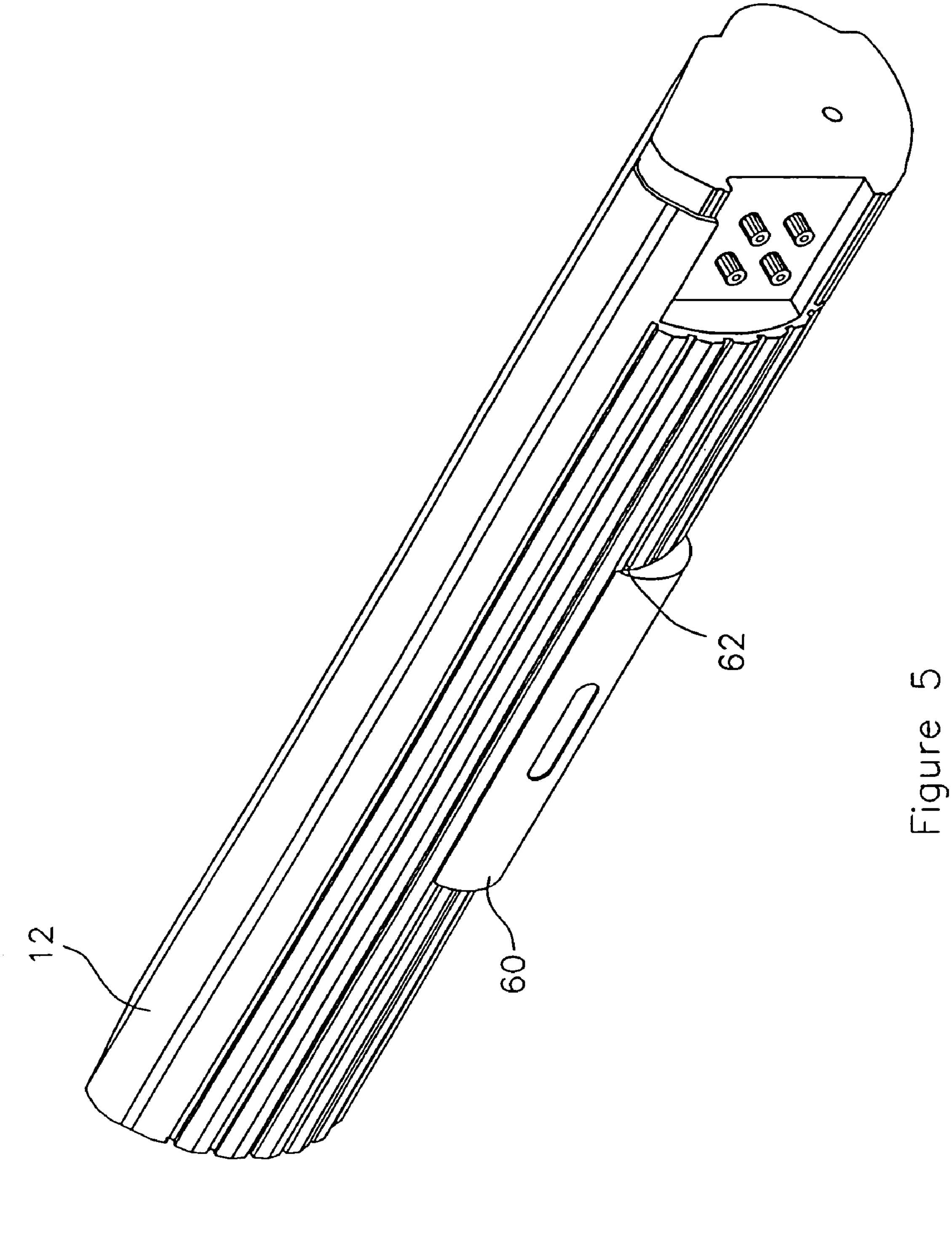
FIG. 5 is a perspective view of the present system, showing a speaker unit being attached to a detachable base unit according to the second embodiment of the present invention.

FIG. 5 is a perspective view of the speaker mounting system 10, according to a second embodiment of the present invention, showing the speaker unit 12 attached to a detachable basestand 60. In this embodiment, a speaker mounting system 10 comprises a detachable base stand 60 including at least one base attaching feature 62. The detachable base stand 60 preferably comprises an extruded aluminum material. In the alternative, the detachable base stand 60 comprises a hard, durable material such as steel, a wood, an aluminum, a fiberglass, a metal alloy, an aluminum alloy, a plastic, or a like material. In FIG. 5, the speaker unit 12 preferably is a center channel speaker.

Figure 6A:
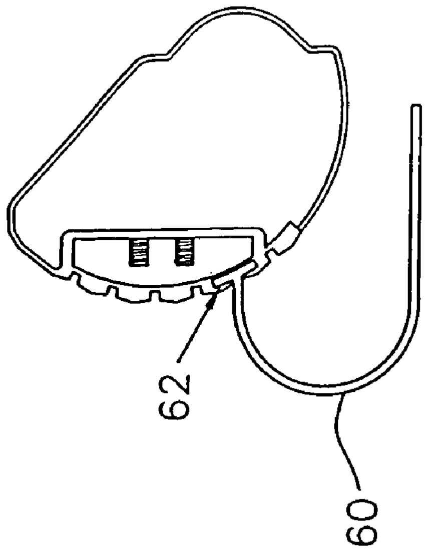
FIG. 6A is a side view of the present system, showing at least one base attaching feature according to the second embodiment of the present invention.
Figure 6:
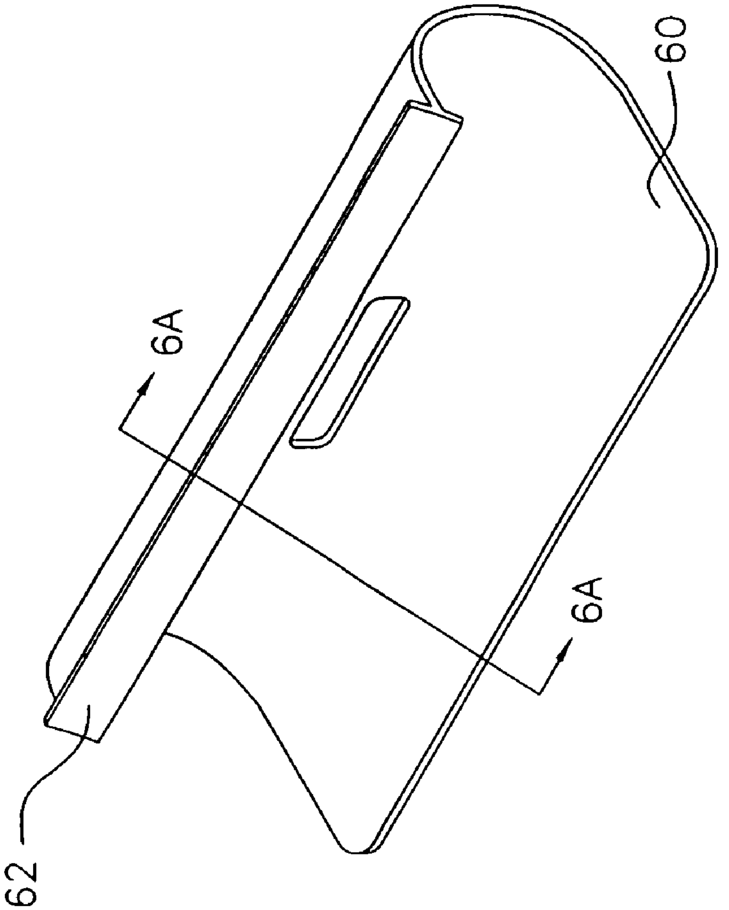
FIG. 6 is a perspective view of the detachable base unit, showing at least one base attaching feature according to the second embodiment of the present invention.

FIG. 6 is a perspective view of the detachable base stand 60, showing at least one base attaching feature 62 according to the second embodiment of the present invention. In FIG. 6, the detachable base stand 60 includes at least one base attaching feature 62 that mates with one of a plurality of angularly spaced apart receiving features 44 on a semi-circular shaped surface 41 of a speaker unit 12. The at least one base attaching feature 62 is adapted for removably engaging a plurality of angularly spaced apart receiving features 44 on a semi-circular shaped surface 41 of a speaker unit 12. The removable sliding feature allows a user an easy method, without the need for tools, for detaching and reattaching a speaker unit 12 from the detachable base stand 60. FIG. 6A is a side view of at least one base attaching feature 62 disposed on the detachable base stand 60. Further, the at least one base attaching feature 62 may be marked so that a user may remove a speaker unit 12 from a base stand and later replace the speaker, if desired, on the same marks. Finally, the type, location, or spacing of the base stand and the other features such as at least one base attaching feature and plurality of angularly spaced apart receiving features are only meant to be to exemplary.

Information as herein shown and described in detail is fully capable of attaining the above-described invention, the present preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, material, or method step is explicitly recited in the claims. However, one skilled in the art should recognize that various changes and modifications in form and material details may be made without departing from the spirit and scope of the inventiveness as set forth in the appended claims. No claim herein is to be construed under the provisions of 35 U.S.C. § 112, sixth paragraph, unless the element is expressly recited using the phrase "means for."

What is claimed:

1. A speaker mounting system comprising:

a surface mounting bracket including at least one attaching feature; and a speaker unit having at least one speaker and engaging means coupled to the mounting bracket and to the speaker unit for reproducibly orienting the speaker unit with respect to the mounting bracket, said engaging means including a plurality of grooves disposed externally on a surface of the speaker unit for defining an angularly spaced-apart fixed receiving feature having a plurality of unique locations adapted for removably engaging the at least one attaching feature.

2. A speaker mounting system in accordance with claim 1, wherein said at least one attaching feature is a flanged structure.

3. A speaker mounting system in accordance with claim 1, wherein said plurality of angularly spaced apart receiving features are flanged structures that radially extend from said shaped surface.

4. A speaker mounting system in accordance with claim 1, wherein said at least one audio speaker is at least one linear array of spaced apart speakers selected from the group consisting of tweeters and midrange speakers.

5. A speaker mounting system in accordance with claim 3, wherein said at least one audio speaker includes at least one linear array of speakers selected from the group consisting of tweeters and midrange speakers.

6. A speaker mounting system in accordance with claim 1, wherein said at least one audio speaker comprises a plurality of linearly spaced apart speaker arrays.

7. A speaker mounting system in accordance with claim 1, wherein said surface mounting bracket further comprises a bracket connecting surface being mechanically connected at an angle θ relative a bracket arm, and wherein the angle θ is adapted to provide a speaker unit pointing adjustment.

8. A speaker mounting system in accordance with claim 7, wherein said surface mounting bracket, said bracket arm, and said at least one attaching feature comprise an extruded aluminum material.

9. A speaker mounting system comprising:

a detachable base stand including at least one base attaching feature; and a speaker unit having at least one audio speaker and having engaging means for fixedly and reproducibly orienting the speaker unit, wherein the engaging means comprises a plurality of grooves disposed externally on a shaped surface of the speaker unit, defining an angularly spaced apart fixed receiving feature having a plurality of unique locations adapted for removably engaging the at least one attaching feature.

10. A speaker mounting system in accordance with claim 9, wherein said at least one base attaching feature is a flanged structure.

11. A speaker mounting system in accordance with claim 9, wherein said plurality of angularly spaced apart receiving features are flanged structures that radially extend from said shaped surface.

12. A speaker mounting system in accordance with claim 9, wherein said at least one audio speaker includes a plurality of linearly spaced apart speaker arrays selected from the group consisting of tweeters and midrange speakers.

13. A speaker mounting system in accordance with claim 11, wherein said at least one audio speaker includes at least two linear arrays of speakers selected from the group consisting of tweeters and midrange speakers.

14. A speaker mounting system in accordance with claim 9, wherein said at least one audio speaker includes at least one linear array of speakers selected from the group consisting of tweeters and midrange speakers.

15. A speaker mounting system in accordance with claim 9, wherein said base attaching feature further comprises a bracket connecting surface being mechanically connected at an angle θ relative to a bracket arm, and wherein the angle θ is adapted to provide a speaker unit pointing adjustment.

16. A speaker mounting system in accordance with claim 15, wherein said surface mounting bracket, said bracket arm, and said at least one attaching feature comprise an extruded aluminum material.

17. A method for mounting a speaker, said method comprising the steps of:

providing means for mounting selected from the group consisting of a surface mounting bracket and a detachable base stand, said mounting means including at least one attaching feature;

providing a speaker unit including at least one audio speaker, said speaker unit having a semi-circular shaped surface, said semi-circular shaped surface having a plurality of grooves disposed externally on said semi-circular shaped surface, said grooves defining an angularly spaced apart fixed receiving feature, said semi-circular shaped surface further including an angle marking system adapted to identify a location for at least one speaker unit; and removably engaging said plurality of grooves with said at least one attaching feature.

18. A speaker mounting system in accordance with claim 1, wherein said shaped surface further comprises an angle marking system adapted to indicate the unique orientation of the speaker unit for each fixed receiving feature.

19. A speaker mounting system in accordance with claim 9, wherein said shaped surface further comprises an angle marking system adapted to indicate the unique orientation of the speaker unit for each fixed receiving feature.

20. A speaker mounting system in accordance with claim 19, wherein said at least one audio speaker includes at least one linear array of speakers selected from the group consisting of tweeters and midrange speakers.

* * * * *